United States Patent
Theobald et al.

(10) Patent No.: US 6,774,682 B2
(45) Date of Patent: Aug. 10, 2004

(54) CIRCUIT CONFIGURATION FOR DRIVING A SEMICONDUCTOR SWITCHING ELEMENT AND METHOD FOR SAME

(75) Inventors: Thomas Theobald, München (DE); Ludwig Leipold, deceased, late of München (DE), by Brigitte Hiebl-Leipold, Stefan-Michael Leipold, executors

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 10/026,241

(22) Filed: Dec. 21, 2001

(65) Prior Publication Data

US 2002/0093372 A1 Jul. 18, 2002

(30) Foreign Application Priority Data

Dec. 21, 2000 (DE) ......................................... 100 64 123

(51) Int. Cl.$^7$ ................................................ H03B 1/00
(52) U.S. Cl. ...................................................... 327/110
(58) Field of Search ................................. 327/108, 110, 327/434, 478

(56) References Cited

U.S. PATENT DOCUMENTS 5,789,951 A * 8/1998 Shen et al. .................. 327/110
5,977,814 A    11/1999 Ishii
6,326,819 B1 * 12/2001 Carlson ....................... 327/108

FOREIGN PATENT DOCUMENTS

DE    196 12 984 C2    4/1999
EP     0 501 481 A2    9/1992

* cited by examiner

Primary Examiner—Jeffrey Zweizig
(74) Attorney, Agent, or Firm—Laurence A. Greenberg; Werner H. Stemer; Ralph E. Locher

(57) ABSTRACT

A circuit configuration for driving a semiconductor switching element includes an output terminal for the connection of a semiconductor switching element, a capacitive charge storage configuration, which is coupled to the output terminal, a charging and discharging circuit having at least one input for feeding in at least one drive signal and an output connected to the capacitive charge storage configuration, and a discharging circuit with a connecting terminal. The connecting terminal is connected to the capacitive charge storage configuration and provides a discharging current for the charge storage configuration. A charging current or a discharging current for the capacitive charge storage configuration is available at the output depending on the drive signal. A method for driving the semiconductor switching element is also provided.

9 Claims, 5 Drawing Sheets

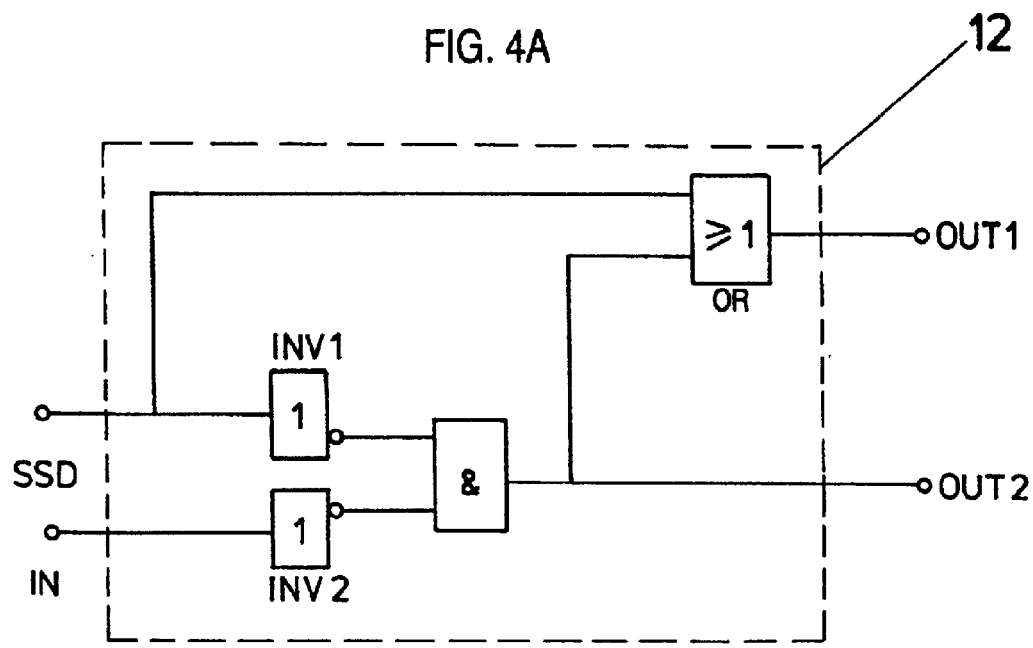

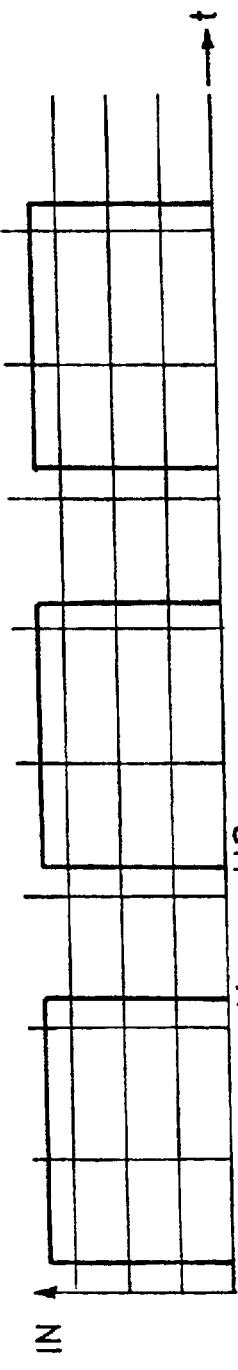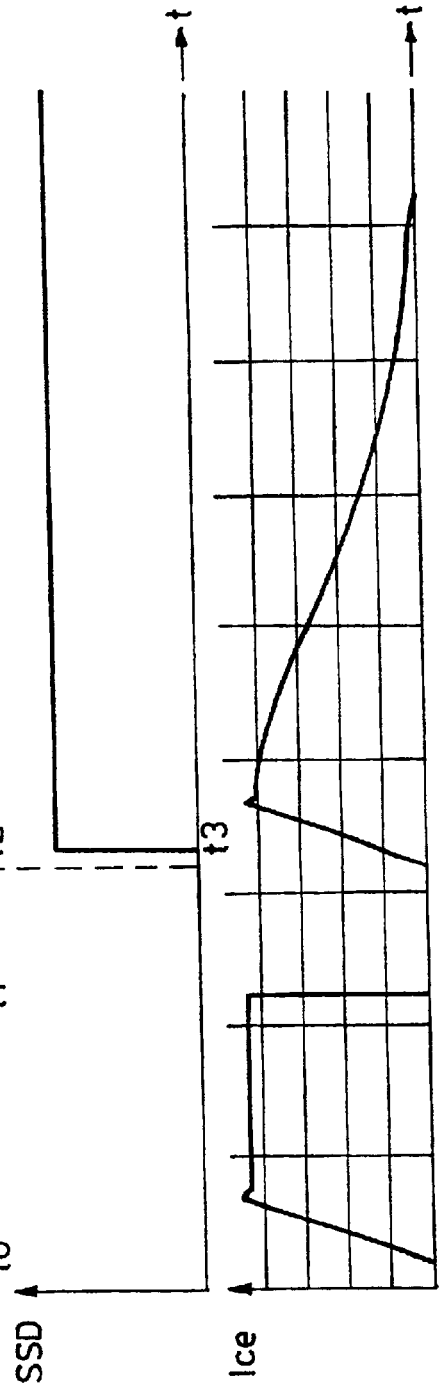
FIG 6A IN
FIG 6B SSD
FIG 6C Ice
FIG 6D Vce

CIRCUIT CONFIGURATION FOR DRIVING A SEMICONDUCTOR SWITCHING ELEMENT AND METHOD FOR SAME

BACKGROUND OF THE INVENTION

Field of the Invention

The invention lies in the field of semiconductor circuits. The invention relates to a circuit configuration for driving a semiconductor switching element, in particular, a semiconductor switching element that is connected up in a device for generating an ignition spark in an automobile.

Such a device for generating an ignition spark with a semiconductor switching element is illustrated in FIG. 1. The device has a transformer TR with a primary coil L1, a power transistor T, and a spark plug Z. The power transistor T is constructed, in particular, as an Insulated Gate Bipolar Transistor (IGBT) or as a so-called power Darlington bipolar stage and is connected in series with the primary coil L1 between two supply potentials V+, GND. The spark plug Z is connected in series with the secondary coil L2 of the transformer TR. Two diodes D1, D2 that are connected in series between the collector terminal and the gate terminal of the power transistor, configured as an IGBT in the example, serve for limiting the collector-emitter voltage of the transistor T by virtue of the transistor T being driven into the on state through these two diodes D1, D2 if the potential at the collector K rises above a predetermined amount.

If the power transistor T is driven into the on state by the application of a suitable drive potential at its gate electrode G, a current flows through the primary coil L1, as a result of which the primary coil L1 takes up energy. If the power transistor T is subsequently turned off, the primary coil induces a high voltage in the electric circuit of the primary coil, the high voltage, or the energy stored in the primary coil, being transmitted to the secondary side, where it leads to the generation of an ignition spark in the spark plug z.

In such devices, disturbance situations can occur in which the generation of an ignition spark is to be prevented under all circumstances, even when the power transistor T is already in the on state and the primary coil L1 has already taken up energy. In such a case, simply switching off the power transistor T would lead to the generation of an ignition spark.

To avoid an ignition spark in such disturbance situations, the prior art includes changing over the collector of the power transistor by suitable circuit measures and, thereby, put at a potential value at which no ignition spark is generated.

In the case of so-called intelligent power transistors fabricated using chip-on-chip technology, a problem arises that the collector of the power transistor is not accessible. In such technology, the power transistor is realized in one semiconductor body and a drive circuit, protective circuits of the transistor, and the like are realized in a second semiconductor body, which is fixed on the first semiconductor body.

Due to the diverse additional functions, in particular, due to integrated protective circuits that deploy in the event of a short circuit of the load, to protect the power transistor, endeavors are being made to be able to use intelligent power transistors, so-called smart FETS or smart IGBTs, also for devices for generating ignition sparks.

SUMMARY OF THE INVENTION

It is accordingly an object of the invention to provide a circuit configuration for driving a semiconductor switching element, preferably, a power transistor, in particular, a power transistor in a device for generating an ignition spark that overcomes the hereinafore-mentioned disadvantages of the heretofore-known devices and methods of this general type and that ensures no ignition spark is generated when a disturbance situation occurs.

With the foregoing and other objects in view, there is provided, in accordance with the invention, a circuit configuration for driving a semiconductor switching element, including an output terminal to be connected to the semiconductor switching element, a capacitive charge storage configuration coupled to the output terminal, a charging and discharging circuit having at least one input receiving at least one drive signal and an output connected to the capacitive charge storage configuration, the charging and discharging circuit providing, at the output, one of the group consisting of a charging current and a first discharging current for the capacitive charge storage configuration depending on the at least one drive signal, a discharging circuit having a connecting terminal connected to the capacitive charge storage configuration, and the connecting terminal providing a second discharging current for the charge storage configuration.

The capacitive charge storage configuration, which is connected to the output, serves for providing a drive potential for a semiconductor switching element, in particular, a power transistor, which can be connected to the output terminal. In such a case, the voltage across the charge storage configuration or the drive potential rises if the charge storage configuration takes up current from the charging and discharging circuit, and the voltage, or the drive potential, falls if the charge storage configuration is discharged.

In such a case, the charging and discharging circuit is configured such that it is able to charge the capacitive charge storage configuration comparatively quickly and also discharge it comparatively quickly. A power transistor connected to the output terminal is in the on state if the charge storage configuration is charged and it is in the off state if the charge storage configuration is discharged. In disturbance-free operation, the capacitive charge storage configuration is, therefore, charged rapidly through the charging and discharging circuit to drive the connected power transistor into the on state, and the capacitive charge storage configuration is discharged rapidly through the charging and discharging circuit to turn off the connected power transistor. In such a case, the time duration within which the charge storage configuration is discharged through the charging and discharging circuit, or within which the power transistor undergoes a transition from the on state to the off state, can be coordinated with the further connections of the power transistor and can be set to such a short time duration that when the power transistor is switched off, a sufficient voltage is induced in a connected primary coil of a transformer, so that an ignition spark is generated in an ignition coil connected to the secondary side of the transformer.

Preferably, in accordance with another feature of the invention, the discharging circuit provides a constant discharging current for the charge storage configuration, the discharging current being significantly lower than a discharging current of the charging and discharging circuit and also significantly lower than a charging current of the charging and discharging circuit. The discharging circuit, which draws current from the charge storage configuration, preferably, permanently, does not influence the functioning of the circuit configuration in disturbance-free operation, in which the charge storage configuration is alternately charged and discharged through the charging and discharging circuit.

When a disturbance situation occurs, the charging and discharging circuit can be driven by the drive signal such that it provides no current at its output terminal. In such a case, only the discharging circuit acts, which continuously draws current from the charge storage configuration until the latter is completely discharged. The discharging current is coordinated with the capacitance of the charge storage configuration such that the voltage change brought about by the discharging current across the charge storage configuration is so small that the power transistor connected to the output terminal undergoes a transition from an on state to an off state so slowly that an ignition spark is not generated in a spark plug connected on the secondary side.

By the circuit configuration according to the invention, the generation of an ignition spark can be prevented exclusively by driving the control terminal, that is to say, the gate terminal when using MOSFET or IGBT as semiconductor switching elements, by virtue of the power transistor being transferred very slowly from the on state to an off state when a disturbance situation occurs.

The capacitive charge storage configuration includes a capacitor in the simplest case. It is also possible to use any further charge storage configurations desired.

In accordance with a further feature of the invention, the discharging circuit has a bipolar transistor and a current source, the base of the bipolar transistor being connected to the capacitive charge storage configuration and the current source being connected to the emitter of the bipolar transistor. In the embodiment, the discharging current of the discharging circuit is the base-emitter current of the bipolar transistor. Such a discharging circuit can realize discharging currents in the nanoamperes range, thereby ensuring sufficiently slow discharging of the charge storage configuration and, hence, sufficiently slow turning-off of the semiconductor switch when a disturbance situation occurs.

In accordance with an added feature of the invention, the charging and discharging circuit has a first and a second controllable switch each having a control input, which are connected in series between a first and a second supply potential. In such a case, the first and second switches can be driven by a drive circuit to which the at least one drive signal is fed. The drive circuit is configured such that it drives the first and second switches complementarily in disturbance-free operation, that is to say, drives only in each case one of the two switches into the on state, in order thereby to connect the charge storage configuration either to the first supply potential or to the second supply potential, in order either to charge or to discharge the charge storage configuration. Furthermore, the drive circuit is configured to turn off both switches when a disturbance situation occurs to prevent current both from being output to the charge storage configuration and from being taken up by the charge storage configuration.

In accordance with an additional feature of the invention, the drive circuit has a first output terminal connected to the first control input and a second output terminal connected to the second control input.

In accordance with yet another feature of the invention, the drive circuit preferably has a first input terminal for feeding in a first drive signal and a second input terminal for feeding in a second drive signal, the first and second switches being driven complementarily according to the first drive signal during disturbance-free operation, and the second drive signal serving to indicate a disturbance situation and both switches being turned off if the second drive signal assumes a predetermined level that represents a disturbance situation.

In accordance with yet a further feature of the invention, the first controllable switch has an on state and an off state, the second controllable switch has an on state and an off state, and the drive circuit drives one switch of the group consisting of the first controllable switch and the second controllable switch into the on state and the other switch of the group consisting of the first controllable switch and the second controllable switch into the off state dependent upon the at least one drive signal.

In accordance with yet an added feature of the invention, the at least one drive signal includes a first drive signal and a second drive signal, the at least one input includes a first input and a second input, the drive circuit has a second input terminal connected to the second input for feeding in the second drive signal, and the drive circuit drives the first controllable switch and the second controllable switch jointly into the off state depending on the second drive signal.

In accordance with yet an additional feature of the invention, an operational amplifier is advantageously connected between the charge storage configuration and the output terminal of the circuit configuration. The operational amplifier preferably has a gain of 1 and ensures that the voltage across the charge storage configuration is also present at the control terminal of a connected power transistor. In such a case, the operational amplifier is necessary, in particular, to prevent the drive potential of the power transistor from rising above the potential at the charge storage configuration, for example, due to a Miller capacitance that may be present in the power transistor.

With the objects of the invention in view, there is also provided a method for driving a semiconductor switching element having a control input and a load path, including the steps of connecting the load path of the semiconductor switching element in series with a primary coil of a transformer, connecting an ignition spark generating configuration in series with a secondary coil of the transformer, applying a drive voltage to the control input of the semiconductor switching element to an extent sufficient to drive the semiconductor switching element into an on state, generating an ignition spark in the ignition configuration by reducing the drive voltage of the semiconductor switching element within a sufficient period of time to induce a voltage across the load path sufficient to generate an ignition spark in the ignition configuration, and preventing an ignition spark in the ignition configuration by reducing the drive voltage of the semiconductor switching element within a sufficient period of time to induce a voltage across the load path insufficient to generate an ignition spark in the ignition configuration.

To generate an ignition spark, the method provides for a drive voltage to be applied to the control input of the semiconductor switching element that is large enough to drive the semiconductor switch into the on state. To generate an ignition spark, the drive voltage of the semiconductor switching element is reduced, the drive voltage being changed so rapidly that the voltage induced across the load path suffices to generate an ignition spark in the ignition spark generating device on the secondary side of the transformer. If a disturbance situation occurs in which the generation of an ignition spark is to be prevented despite the semiconductor switching element already being in the on state, the method according to the invention provides for the drive voltage of the semiconductor switching element to be reduced so slowly that the voltage induced across the load path does not suffice to generate an ignition spark in the ignition spark generating device.

Such a method can be carried out by the circuit configuration according to the invention.

Other features that are considered as characteristic for the invention are set forth in the appended claims.

Although the invention is illustrated and described herein as embodied in a circuit configuration for driving a semiconductor switching element, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 4A is a block and schematic circuit diagram of a drive circuit of the charging and discharging circuit according to FIGS. 2 and/or 3;

FIG. 4B is a logic table illustrating the functioning of the drive circuit of FIG. 4A;

FIGS. 6A to 6D are temporal graphs of selected signals according to the invention.

DESCRIPTION OF THE PREFERRED EMBODIMENTS

In the figures, unless specified otherwise, identical reference symbols designate identical parts with the same meaning.

Figure 2:
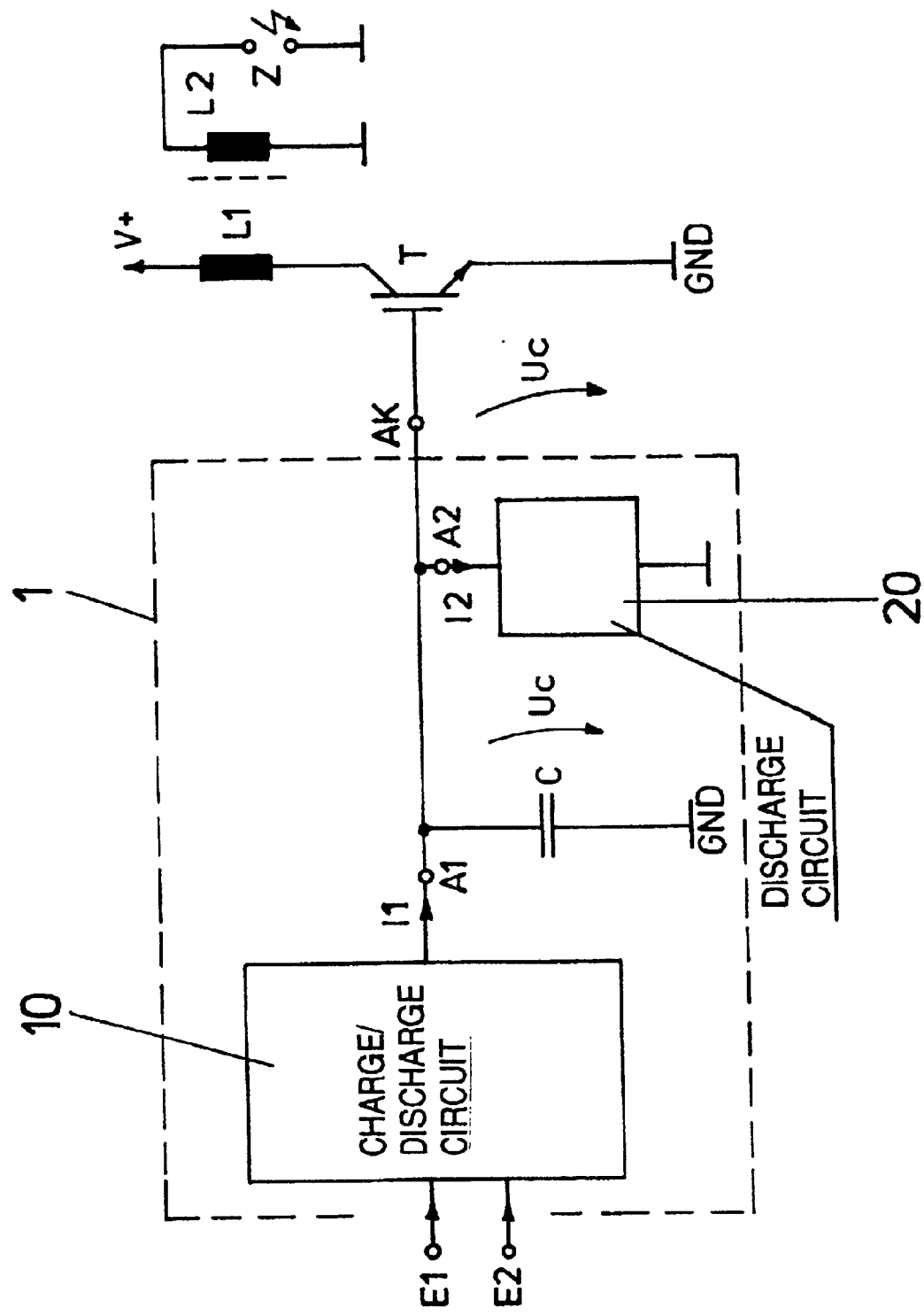
FIG. 2 is a block and schematic circuit diagram of a circuit configuration according to the invention for driving a semiconductor switching element and a semiconductor switching element connected to the circuit configuration.

Referring now to the figures of the drawings in detail and first, particularly to FIG. 2 thereof, there is shown an exemplary embodiment of a circuit configuration 1 according to the invention for driving a semiconductor switching element. The circuit configuration 1 has an output terminal AK, to which, in FIG. 2, in order to illustrate the function of the circuit configuration 1, a power transistor T constructed as an IGBT is connected, which power transistor, in series with a primary coil L1 of a transformer, is connected to a supply voltage V+. In the embodiment, a spark plug Z for generating an ignition spark is connected to a secondary coil L2 of the transformer TR.

The output terminal AK serves for providing a drive potential Uc for the power transistor T, whose gate terminal is connected to the output terminal AK. In the case of the circuit configuration 1 according to the exemplary embodiment, the drive potential Uc is generated depending on a first drive signal IN, which is fed to a first connecting terminal E1 of the circuit configuration, and according to a second drive signal SSD, which is fed to a second connecting terminal E2 of the circuit configuration 1.

The circuit configuration 1 has a charging and discharging circuit 10, a capacitive charge storage configuration, configured as capacitor C in the exemplary embodiment, and a discharging circuit 20. The first drive signal IN and the second drive signal SSD are fed to the charging and discharging circuit 10 and an output terminal A1 of the charging and discharging circuit 10 is connected to the capacitor C, whose terminal remote from the charging and discharging circuit 10 is connected to a supply potential GND, preferably, to ground. The discharging circuit 20 has an output terminal A2, which is likewise connected to the capacitor C.

According to the first and second drive signals IN, SSD, the charging and discharging circuit 10 supplies a current I1 to the output terminal A1 that charges or discharges the capacitor C depending on the sign of the current I1. The discharging circuit 20 always supplies a discharging current I2 for discharging the capacitor C. A voltage Uc across the capacitor C forms the output voltage Uc present at the output terminal AK, or the drive potential, for the power transistor T.

The drive circuit 10 is configured such that it charges or discharges the capacitor C depending on the first drive signal IN, that is to say, the sign of the current I1 is dependent on the first drive signal IN. If the capacitor C is charged through the charging and discharging circuit 10, then the voltage Uc across the capacitor C rises and the power transistor T is driven into the on state. As a result, the primary coil L1 takes up energy. If the capacitor C is discharged through the charging and discharging circuit 10, then the voltage Uc across the capacitor C falls, as a result, the power transistor T turns off. In such a case, the discharging current of the charging and discharging circuit 10 and the capacitance of the capacitor C are coordinated with one another such that the power transistor T turns off so rapidly that a sufficiently high voltage is induced on the primary coil L1 to generate an ignition spark at the spark plug on the secondary side.

Furthermore, the charging and discharging circuit 10 is configured such that, in the presence of a disturbance situation, which is indicated by a predetermined level of the second drive signal SSD, the charging and discharging circuit 10 provides no current, that is to say, neither a charging current nor a discharging current, for the capacitor C. The capacitor C, already charged, is then discharged through the discharging circuit 20 with the discharging current I2, the discharging current I2 and the capacitance of the capacitor C being coordinated with one another such that the discharging of the capacitor C transfers the power transistor T from the on state to the off state so slowly that a voltage high enough to generate, on the secondary side of the transformer TR, an ignition spark in the spark plug Z connected thereto is not induced on the primary coil. The discharging current I2 has a significantly smaller magnitude than the charging current provided during disturbance-free operation or the discharging current of the charging and discharging circuit 10. Preferably, the discharging circuit 20 discharges the capacitor C permanently, the discharging current I2 being so small relative to the charging and discharging current I1 that the discharging does not affect the functioning of the circuit configuration 1 during disturbance-free operation.

Figure 1:
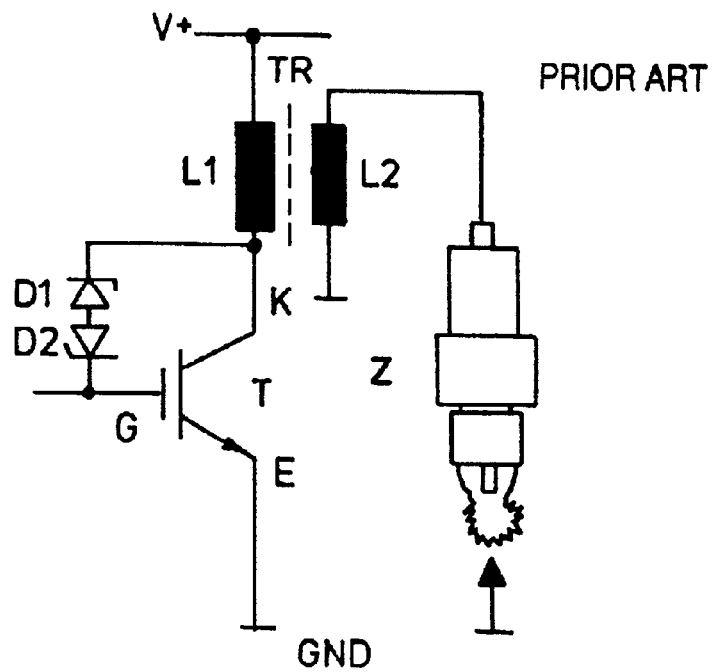
FIG. 1 is a block and schematic circuit diagram of a prior art device for generating an ignition spark with a semiconductor switching element.
Figure 3:
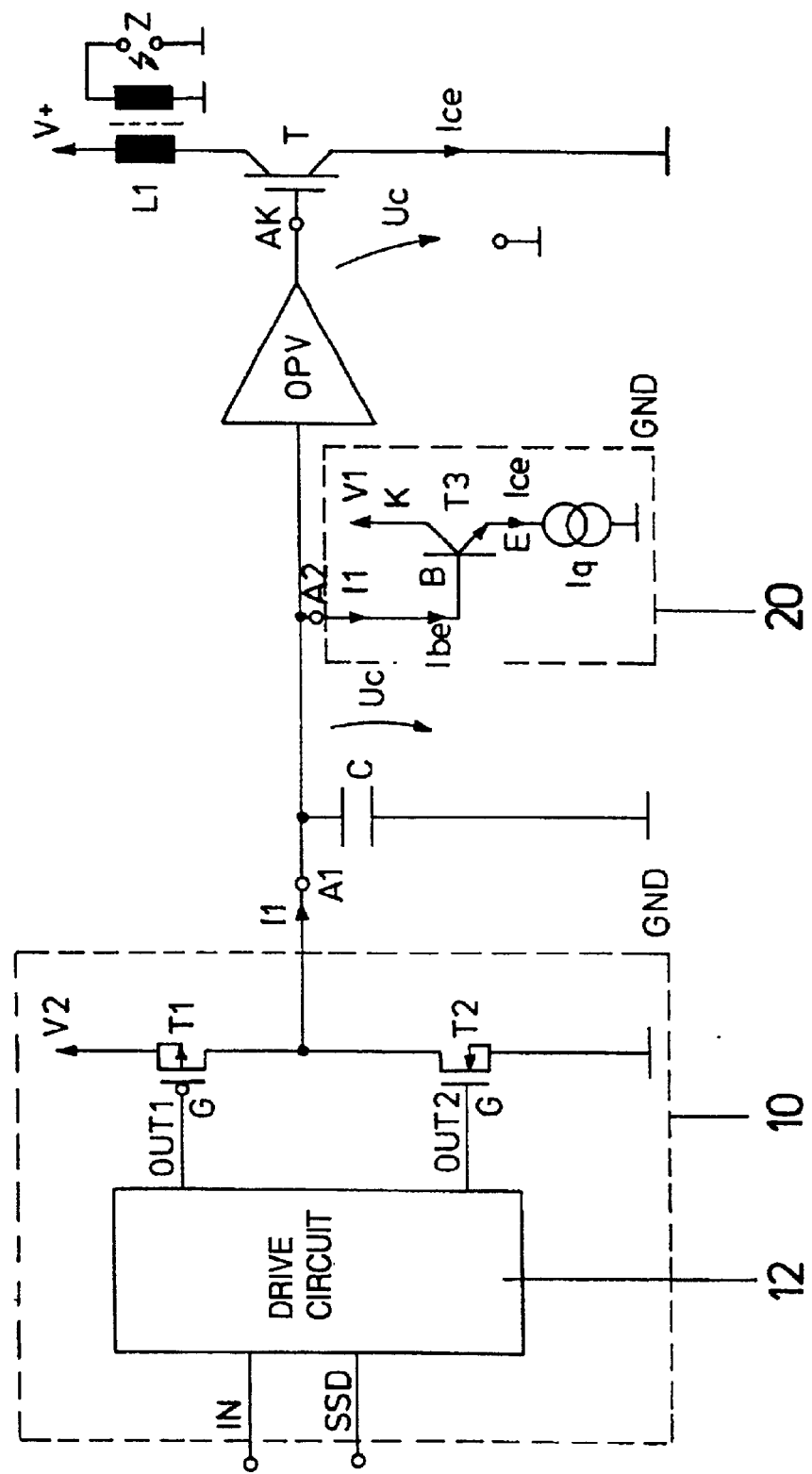
FIG. 3 is a block and schematic circuit diagram of an alternative embodiment of the circuit configuration according to FIG. 2.

FIG. 3 shows an exemplary embodiment of a circuit configuration according to the invention in accordance with FIG. 1, in which the charging and discharging circuit 10 and the discharging circuit 20 are illustrated in detail in accordance with one embodiment of the invention. Furthermore, an operational amplifier OPV is connected between the capacitor C, or the charging and discharging circuit 10 and the discharging circuit 20, and the output terminal AK, the operational amplifier OPV having a gain of 1. The operational amplifier OPV has the task of providing the voltage Uc across the capacitor C, despite possible disturbances caused by parasitic effects, at the output terminal AK and, in particular, of preventing the potential at the gate terminal G of the connected power transistor T from becoming greater than the voltage Uc across the capacitor C.

The charging and discharging circuit 10 has a first transistor T1 and a second transistor T2, which are connected between a first supply potential V2 and a second supply potential GND, ground. The first transistor T1 is configured as a p-channel field-effect transistor and the second transistor T2 is configured as an n-channel field-effect transistor. The charging and discharging circuit 10 furthermore has a drive circuit 12, to which the first drive signal IN and the second drive signal SSD are fed. A first output OUT1 of the drive circuit 12 is connected to a gate terminal G of the first transistor T1 and a second output OUT2 of the drive circuit 12 is connected to a gate terminal G of the second transistor T2. The drive circuit 12 is configured such that, during disturbance-free operation, it drives the first and second transistors T1, T2 complementarily depending on the input signal IN, that is to say, drives only one of the two transistors T1, T2 into the on state and turns off the respective other transistor T1, T2. If the first transistor T1 is driven into the on state, then the capacitor C is charged through the transistor T1 until the capacitor voltage Uc approximately assumes the value of the first supply potential V2. In such a case, the supply potential V2 is chosen such that it is large enough to drive the power transistor T into the on state. If the second transistor T2 turns on in a manner driven by the drive circuit 12, then the capacitor C is discharged to reference-ground potential GND through the second transistor T2. If a disturbance situation occurs that is signaled by a suitable level of the second drive signal SSD, the drive circuit 12 turns off both transistors T1, T2.

In the exemplary embodiment, the discharging circuit 20 has a bipolar transistor T3, whose base B is connected to the capacitor C through the connecting terminal A2 and whose collector-emitter path K-E is connected in series with a current source Iq between a further supply potential V1 and reference-ground potential GND. In the discharging circuit 20, the discharging current I1 corresponds to the base-emitter current Ibe of the bipolar transistor T3. The collector-emitter current Ice of the bipolar transistor T3 corresponds to the current Iq impressed by the current source. Based upon the current gain b of the bipolar transistor T3, for which the following holds true: b=Ice/Ibe, the discharging current I1 is adjustable through the current source in accordance with I1 =Iq/b. Such a discharging circuit 20 can realize discharging currents I1 in the nano-amperes range.

FIG. 4A illustrates an exemplary embodiment of a drive circuit 12, to which the first drive signal IN and the second drive signal SSD are fed and that provides drive potentials for the first and second transistors T1, T2 at outputs OUT1, OUT2. The drive circuit 12 in accordance with FIG. 4A is configured such that, provided that a disturbance situation is not present, the circuit 12 drives the first transistor T1 into the on state and that it turns off the second transistor T2 if the first input signal IN is at a high level (1), and drives the second transistor T2 into the on state and turns off the first transistor T1 if the first input signal IN is at a low level (0). A high level of the second input signal SSD represents a disturbance situation. In such a case, driving the first transistor T1 into the on state means applying a low level to the gate G of the transistor T1, and turning it off means applying a high level to the gate of the transistor T1. Driving the second transistor T2 into the on state means applying a high level to the gate G of the transistor T2, and turning it off means applying a low level to the gate G of the transistor T2.

The functioning of the drive circuit 12 in accordance with FIG. 4A can be seen from the logic table of FIG. 4B. The table reveals that in disturbance-free operation, if the second drive signal SSD is at a low level (0) the first transistor T1 is driven into the on state through the first output OUT1 and the second transistor T2 is driven into the off state through the second output OUT2 if the input signal IN is at a high level (1). Correspondingly, the second transistor T2 is driven into the on state at the second output OUT2 and the first transistor T1 is driven into the off state at the first output OUT1 if the first input signal IN is at a low level (0).

If the second drive signal SSD is at a high level that represents a disturbance situation, then the first transistor T1 is turned off at the first output OUT1 and the second transistor T2 is also turned off at the second output OUT2.

A drive circuit 12 that realizes such a function has a first and second inverter INV1, INV2, which feed an inverted first drive signal IN and an inverted second drive signal SSD to an AND element AND, whose output is connected to the second output OUT2 for driving the second transistor T2. The output signal of the AND element AND is furthermore fed to an OR element OR, to whose further input the second drive signal SSD is fed and whose output is connected to the first output OUT1 for driving the first transistor T1.

Thus, the drive circuit 12 in accordance with FIG. 4A ensures that the capacitor C, according to the first input signal IN, is charged or discharged through the configuration including the first and second switches T1, T2, provided that a disturbance situation is not present. In the presence of a disturbance situation, the two transistors T1, T2 are turned off according to the second drive signal SSD. As a result, the charged capacitance C is discharged exclusively through the discharging circuit 20.

Figure 5:
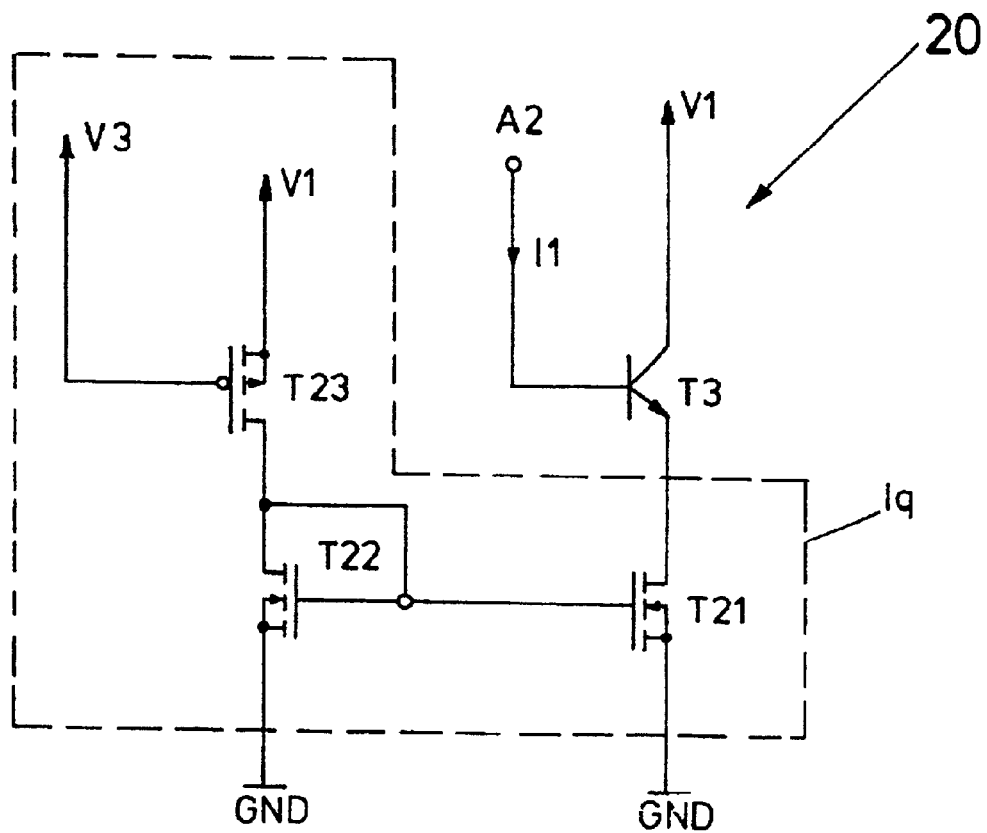
FIG. 5 is a schematic circuit diagram of the discharging circuit of FIGS. 2 and/or 3.

FIG. 5 shows a further exemplary embodiment of the discharging circuit 20, in which the current source Iq is realized by a current mirror including a first field-effect transistor T21, a second field-effect transistor T22, and a further field-effect transistor T23. The field-effect transistor T23 is connected in series with the field-effect transistor T22 between a supply potential V1 and reference-ground potential GND. A constant drive potential V3 is fed to a gate terminal G of the field-effect transistor T23. In the exemplary embodiment, the first and second field-effect transistors T21, T22 are configured as n-channel field-effect transistors, while the further field-effect transistor T23 is configured as a p-channel field-effect transistor.

The functioning of the circuit configuration according to the invention is explained below with reference to FIGS. 6A to 6D, which shows the temporal profile of selected signals depicted in the figures described above, against time. FIG. 6A illustrates the temporal profile of the first drive signal IN, FIG. 6B illustrates the temporal profile of the second drive signal SSD, FIG. 6C illustrates the temporal profile of the emitter current Ice of the power transistor T, and FIG. 6D illustrates the temporal profile of the collector-emitter voltage Vce of the power transistor T.

During initially disturbance-free operation, the second drive signal SSD is at a low level. If the first drive signal IN changes from a low level to a high level, then the first transistor T1 is driven into the on state and the second transistor T2 is turned off to charge the capacitor C. The output voltage Uc, which serves as gate-emitter voltage of the power transistor T, approximately assumes the value of the first supply potential V2. As a result, the power transistor T turns on. A current that rises proportionally to the applied supply voltage over time then flows through the primary coil L1. The collector-emitter voltage of the power transistor T falls to a low value with the switching-on of the power transistor T.

The signal profile in accordance with FIGS. 6A to 6D was determined in the case of a circuit configuration according to the invention to which a power transistor having a load current limiting circuit was connected. Such current limiting circuit configurations are prior art in the case of intelligent power transistors, and so a description of their functioning is unnecessary. The load current limiting circuit has the task, as shown, in particular, by the temporal profile of the emitter current Ice, of limiting the current through the power transistor T, so that the load current no longer rises further upon reaching a maximum value in the case of the power transistor on which the temporal profile in accordance with FIGS. 6A to 6D is based. With the commencement of the voltage limiting, a short voltage pulse occurs in the collector-emitter voltage, which, however, does not suffice to generate an ignition spark on the secondary side of the transformer TR. The collector-emitter voltage Vce then remains at a voltage level that is higher than before the commencement of the voltage limiting.

In the example in accordance with FIGS. 6A to 6D, the first input signal IN assumes an upper level at the instant T0 and falls to the lower level again at the instant T1. When the first input signal IN falls to the lower signal level, the first transistor T1 is turned off and the second transistor T2 is turned on. As a result, the capacitor C is discharged very rapidly to the reference-ground potential GND and the output voltage Uc approximately assumes the value 0. The power transistor T thereby turns off very rapidly, which can be seen from the abrupt change in the emitter current Ice in FIG. 6c at the instant t1. As a result, a high voltage is induced in the primary coil L1, which voltage suffices to generate an ignition spark in the spark plug Z on the secondary side.

At the instant t2, the first drive signal IN again rises to the upper signal level to charge the capacitor C through the first transistor T1. However, a disturbance situation occurs at the instant t3. As a result, the second drive signal SSD assumes an upper signal level. The first and second transistors T1, T2 are both turned off by the drive circuit 12 at the instant t3. Starting from the instant t3, the capacitor C is slowly discharged through the discharging circuit 20, the power transistor T, as can be seen from FIG. 6C, remaining in the on state until the voltage Uc has fallen, as a result of the discharging, to a value at which the transistor T begins to turn off. The emitter current Ice still reaches the maximum value before the transistor begins to turn off. FIG. 6C shows the slow decrease in the emitter current within the period of time in which the power transistor is transferred to the off state. The collector-emitter voltage of the power transistor rises slightly in such a case. The voltage induced during the slow switching-off of the power transistor does not suffice to generate an ignition spark on the secondary side.

We claim:

1. A circuit configuration for driving a semiconductor switching element, comprising:
   an output terminal to be connected to the semiconductor switching element;
   a capacitive charge storage configuration coupled to said output terminal;
   a charging and discharging circuit having:
      at least one input receiving at least one drive signal; and
      an output connected to said capacitive charge storage configuration;
   said charging and discharging circuit providing, at said output, one of the group consisting of a charging current and
   a first discharging current for said capacitive charge storage configuration depending on the at least one drive signal;
   a discharging circuit having a connecting terminal connected to said capacitive charge storage configuration; and
   said connecting terminal providing a second discharging current for said charge storage configuration lower than said first discharging current.

2. The circuit configuration according to claim 1, wherein said second discharging circuit is substantially constant.

3. The circuit configuration according to claim 1, including:
   a first supply potential; and
   a second supply potential;
   said charging and discharging circuit having:
      a first controllable switch with a first control input;
      a second controllable switch with a second control input; and
      a drive circuit connected to said first control input and said second control input;
   said first controllable switch and said second controllable switch connected in series between said first supply potential and said second supply potential; and
   each of said first controllable switch and said second controllable switch connected to said output.

4. The circuit configuration according to claim 3, wherein said drive circuit has:
   a first output terminal connected to said first control input; and
   a second output terminal connected to said second control input.

5. The circuit configuration according to claim 3, wherein:
   said first controllable switch has an on state and an off state;
   said second controllable switch has an on state and an off state; and
   said drive circuit drives one switch of the group consisting of said first controllable switch and said second controllable switch into said on state and the other switch of the group consisting of said first controllable switch and said second
   controllable switch into said off state dependent upon the at least one drive signal.

6. The circuit configuration according to claim 5, wherein:
   the at least one drive signal includes a first drive signal and a second drive signal;
   said at least one input includes a first input and a second input;
   said drive circuit has a second input terminal connected to said second input for feeding in the second drive signal, and
   said drive circuit drives said first controllable switch and said second controllable switch jointly into said off state depending on said second drive signal.

7. A circuit configuration for driving a semiconductor switching element, comprising:

an output terminal to be connected to the semiconductor switching element;

a capacitive charge storage configuration coupled to said output terminal;

a charging and discharging circuit having:
   at least one input receiving at least one drive signal; and
   an output connected to said capacitive charge storage configuration;

said charging and discharging circuit providing, at said output, one of the group consisting of a charging current and a first discharging current for said capacitive charge storage configuration depending on the at least one drive signal;

a discharging circuit having a connecting terminal connected to said capacitive charge storage configuration, said connecting terminal providing a second discharging current for said charge storage configuration said discharging circuit having a bipolar transistor and a current source;

said transistor having a base connected to said capacitive charge storage configuration and an emitter connected to said current source.

8. A circuit configuration for driving a semiconductor switching element, comprising:

an output terminal to be connected to the semiconductor switching element;

a capacitive charge storage configuration coupled to said output terminal;

a charging and discharging circuit having:
   at least one input receiving at least one drive signal; and
   an output connected to said capacitive charge storage configuration;

said charging and discharging circuit providing, at said output, one of the group consisting of a charging current and a first discharging current for said capacitive charge storage configuration depending on the at least one drive signal;

a discharging circuit having a connecting terminal connected to said capacitive charge storage configuration;

said connecting terminal providing a second discharging current for said charge storage configuration; and an operational amplifier connected between said capacitive charge storage configuration and said output terminal.

9. A method for driving a semiconductor switching element having a control input and a load path, which comprises:

connecting the load path of the semiconductor switching element in series with a primary coil of a transformer;

connecting an ignition spark generating configuration in series with a secondary coil of the transformer;

applying a drive voltage to the control input of the semiconductor switching element to an extent sufficient to drive the semiconductor switching element into an on state;

generating an ignition spark in the ignition configuration by reducing the drive voltage of the semiconductor switching element within a sufficient period of time to induce a voltage across the load path sufficient to generate an ignition spark in the ignition configuration; and preventing an ignition spark in the ignition configuration by reducing the drive voltage of the semiconductor switching element within a sufficient period of time to induce a voltage across the load path insufficient to generate an ignition spark in the ignition configuration.

* * * * *